(12) United States Patent
Feldman et al.

(10) Patent No.: US 7,255,570 B1
(45) Date of Patent: Aug. 14, 2007

(54) COMPUTER SYSTEM FOR PCI-EXPRESS CARD

(76) Inventors: Michael Feldman, 148 Carl Tennen St., Thornhill, Ontario (CA) L4J7B1; Alexander Feldman, 35 Fifefield Dr., Maple, Ontario (CA) L6A1J2; Boris Feldman, 1085 Steeles Av. West Apt. 802, Toronto, Ontario (CA) M2R2T1

( * ) Notice: Subject to any disclaimer, the term of this patent is extended or adjusted under 35 U.S.C. 154(b) by 0 days.

(21) Appl. No.: 11/590,484

(22) Filed: Nov. 1, 2006

(51) Int. Cl.
*H01R 12/00* (2006.01)

(52) U.S. Cl. .......................................... 439/64; 439/377

(58) Field of Classification Search ................... 439/64, 439/377, 59
See application file for complete search history.

(56) References Cited

U.S. PATENT DOCUMENTS 5,815,377 A * 9/1998 Lund et al. .................. 361/802
2006/0160414 A1 * 7/2006 Chou et al. .............. 439/541.5

* cited by examiner

*Primary Examiner*—Tho D. Ta

(57) ABSTRACT

The present invention proposes to use additional support tabs for the stabilization of the PCI-express add-in cards, in particular, PCI-express add-in cards having a connector the size of one, four or eight links.

7 Claims, 6 Drawing Sheets

Priory art

COMPUTER SYSTEM FOR PCI-EXPRESS CARD

FIELD OF THE INVENTION

The present invention relates to the field of electrical connectors, and, more specifically, to add-in cards that are based on the PCI-express standard.

BACKGROUND OF THE INVENTION

The new interface PCI-express [1] is becoming more and more popular. For testing and debugging the PCI-express card different types of the test equipment are used, such as the PCI-express extender. In case the PCI-express card is installed on the PCI-express extender there is no possibility to fix this card in place by means of a standard bracket. It is important that the PCI-express connector is short (in cases of one, four or eight links) and has no special holding fixture. Therefore, the problem of stabilizing the PCI-express card becomes important in this case.

In FIGS. 1a and 1b PCI-express add-in card 10 having PCI-express male connector 11 (plug) is represented. On main board 20 a female PCI-express connector 21 (socket) is located. In FIG. 1b it is shown that PCI-express add-in card 10 is inserted into PCI-express female connector 21. The length of the PCI-express card is significantly longer than the length of PCI-express connector 11 for connector types X1 (one link), X4(four links), and X8(eight links). It can create a danger of PCI-express card inclination in socket 21 and can break the connection quality.

The PCI-express add-in cards of type X16 (16 links) are equipped with a special feature to prevent said inclination. This feature (31) is "hockey stick"-shaped and is located on the bottom edge of PCI-express add-in card 10 (FIG. 2). PCI-express male connector 11 is also located on the bottom edge of the card. The specification [1] and several patents [2-5], for example, define special retention mechanisms that are mounted on main board 20 on which the socket for the PCI-express card is located (said mechanisms aren't shown). This "hockey stick" feature 31 exists only in PCI-express cards X16 (16 links).

Various clips for fastening add-in cards are known, such as described in example [6]. The clip [6] is shaped like an "hourglass" in cross-section and is made of a uniform piece.

The present invention allows to stabilize the PCI-express add-in card position without complex features in cases when the bracket and other mechanisms are not used. It can be useful at work with various extender boards and motherboards using said PCI-express socket.

SUMMARY

The present invention is intended for the stabilization of the PCI-express add-in card [1]. Based on the PCI-express specification [1] all PCI-express add-in cards include a keep-out zone around the hole for special bracket fastening, a feature (short tab) meant to prevent the PCI-express card from being plugged into a normal PCI connector, and a PCI-express male connector (plug) located on the bottom edge of the card. The PCI-express male connector (plug) is used for connection with the PCI-express female connector (socket) located, for example, on the PCI-express extender. Said socket is mounted on the end edge (lateral surface) of said extender board (being on one plane with the said extender board).

The first aspect of the present invention consists in that said main board (for example, the PCI-express extender card) comprises one or two additional support tabs located on the same end edge (lateral surface) on which said socket for inserting PCI-express add-in card is located. Said support tabs are directed towards said PCI-express add-in card when said PCI-express add-in card is inserted into said socket.

The second aspect consists in that when there are two support tabs both these tabs are located around said socket from two opposite sides. The first support tab is located at the end edge between said socket and the main board end edge that is opposite to the bracket edge, when said PCI-express add-in card is inserted into said socket. The second support tab is located at the end edge of the main board between said socket and the bracket edge, when said PCI-express add-in card is inserted into said socket. More precisely, it is located opposite to the "short" tab of the PCI-express add-in card [1].

The third aspect consists in that the height of said first support tab is equal to the distance between, for example, the edge of said extender board and bottom edge of the said PCI-express add-in card when said PCI-express add-in card is inserted into said socket. And in this case the upper edge of said first support tab touches to the bottom edge of the said PCI-express add-in card.

The fourth aspect consists in that said second support tab touches to said "short" tab when said add-in card is inserted into said PCI-express socket.

The fifth aspect consists in that position and geometric form of the first support tab can be various and this first support tab should probably be further from said PCI-express socket for the best stabilization of said PCI-express add-in card.

The sixth aspect consists in that the support tabs are part of the extender board and are made as one piece (the same printed circuit board) with the extender card (outline of each support tabs are included in extender board outline).

All those aspects are valid also if said PCI-express female socket is located on the plane surface of the main board (like computer motherboard). Only in this case said support tabs are made separately and are mounted on the motherboard surface.

BRIEF DESCRIPTION OF THE DRAWINGS

FIG. 1. illustrates a computer system including PCI-express add-in card main board (prior art).

FIG. 4. illustrates the improved computer system for PCI-express add-in cards (two cases of mutual positions of the PCI-express add-in card and the main board in cross-section view).

DETAILED DESCRIPTION OF THE PREFERRED EMBODIMENT

Figure 1A:
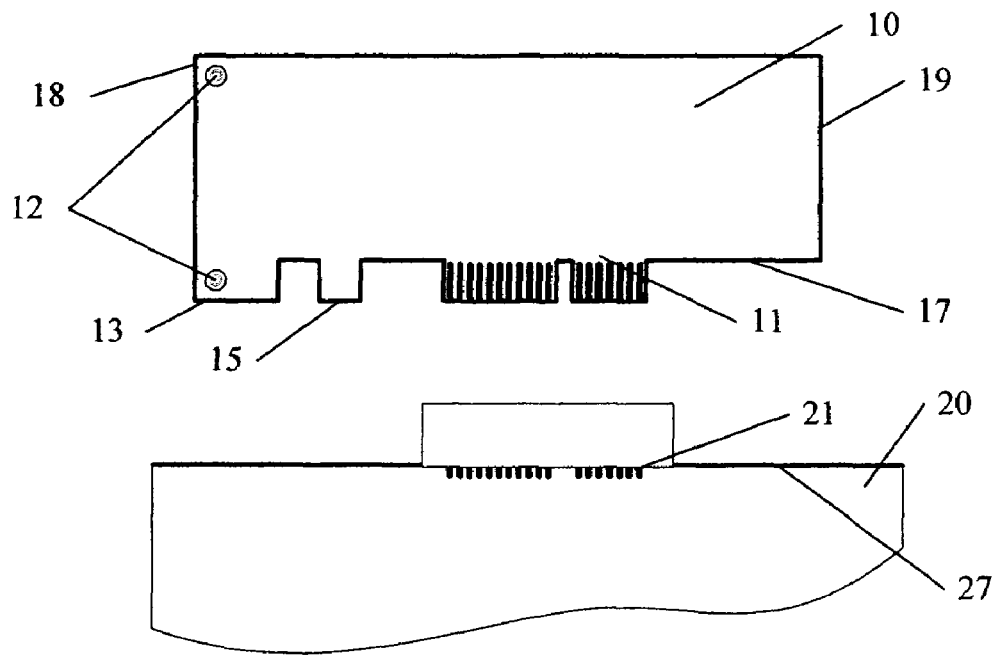
FIG. 1a illustrates a PCI-express add-in card and a female socket mounted on main board separately.

FIG. 1a shows a view of the standard PCI-express add-in card 10 with PCI-express male connector 11 (for example, X1, X4 or X8 type) located on the bottom edge 17 and a female socket 21 mounted at the upper edge 27 of main board 20 ("extender" case). On this FIG. 1a said add-in card 10 and said main board 20 are located separately. According to [1], said PCI-express add-in card 10 comprises a male plug 11, a bottom hole tab 13 (bottom mounting hole for bracket is placed on this tab) and a short tab 15. These tabs 13 and 15 and said plug 11 are located on bottom edge 17 of said add-in card 10. They are made of the same material as said PCI-express card 10 and are also their continuation. The height of short tab 15 is defined by PCI-express specification [1] and is equal to 8.25 mm. The length of PCI-express male connector 11 depends of the numbers of links (equal to 28.3 mm in case (X1), 42.3 mm in case (X4), and 59.3 mm in case (x8)). The length of the PCI-express add-in card has to be more than 65.30 mm and less than 312.00 mm [1]. The majority of the PCI-express add-in cards have a length close to 165.65 mm (half length) or 312.00 mm (full length). On FIG. 1a the following edges are designated also: edge 18 intended for the fastening of bracket (bracket edge) and opposite edge 19.

Figure 1B:
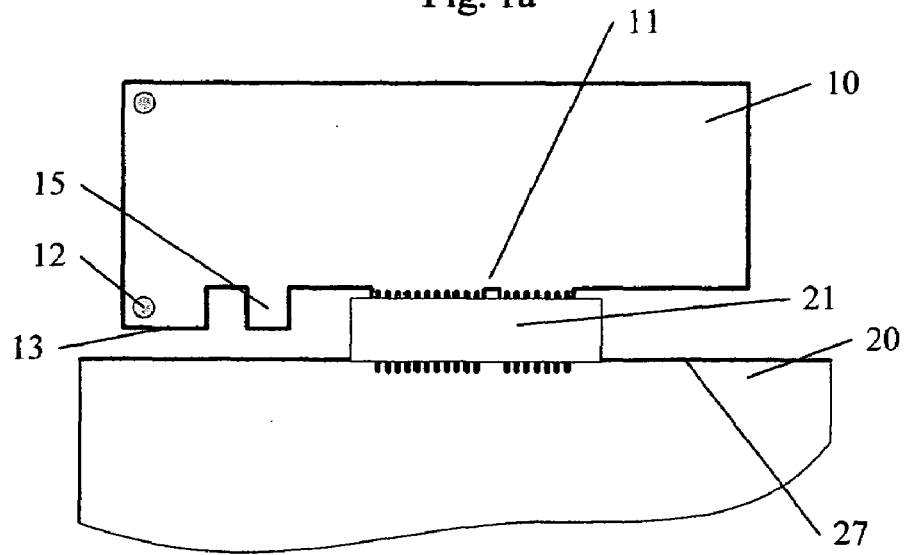
FIG. 1b illustrates a PCI-express add-in card in case this card is inserted into a female socket mounted on main board.

FIG. 1b shows the case when said plug 11 of said add-in card 10 is inserted into socket 21 mounted on main board 20. The PCI-express add-in card is fastened only by socket 21 in this case.

Figure 2:
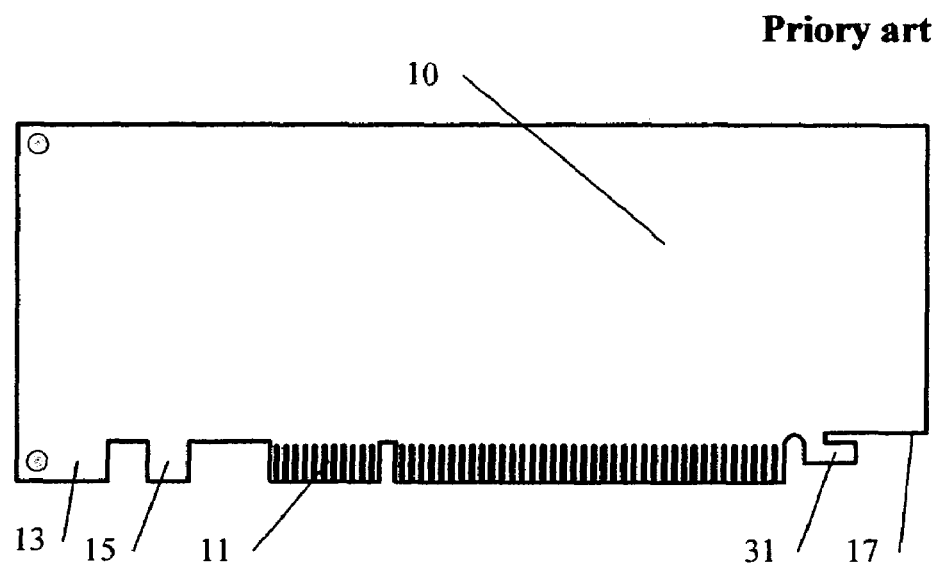
FIG. 2. illustrates a PCI-express add-in card with X16 connector (16 links).

In FIG. 2 the standard X16 type PCI-express add-in card 10 according to [1] is shown. This card 10 comprises plug 11, short tab 15 and "hockey stick" 31 (for fastened said card when this card is inserted into a socket). This "hockey stick" 31 exists only on the X16 type of the PCI-express add-in card [1]. In this case the main board has to provide a special mechanism (not shown) for the fastening of said "hockey stick" 31.

Figure 3:
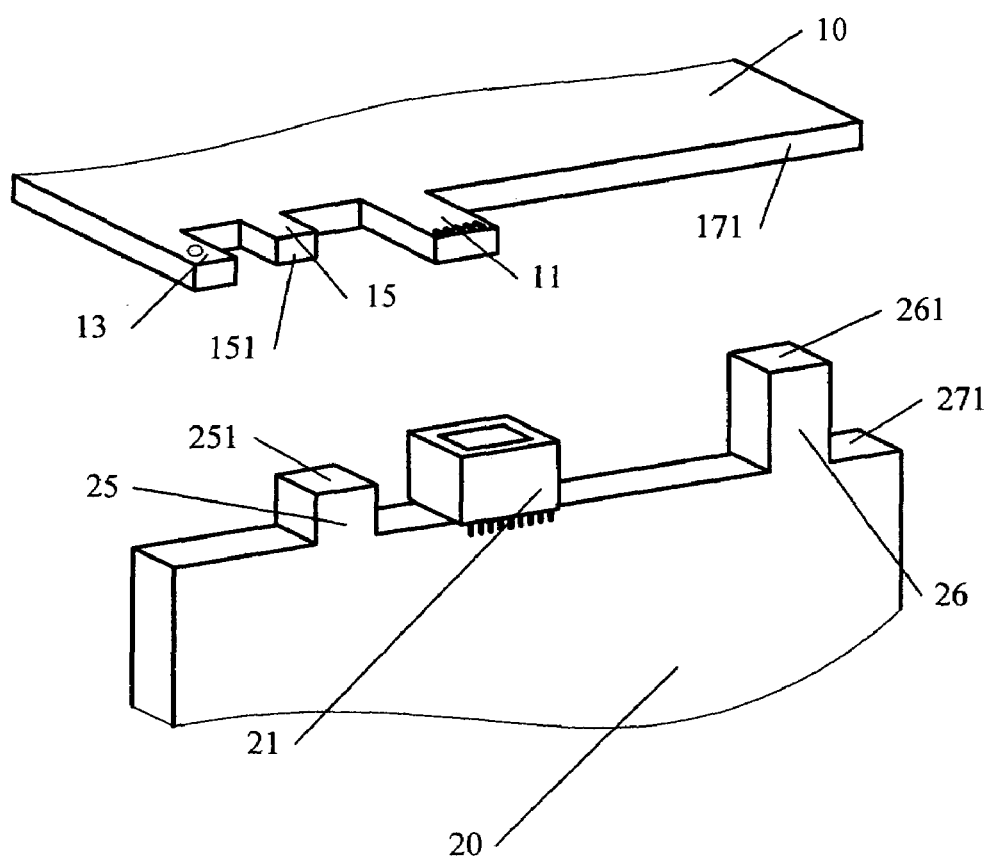
FIG. 3. illustrates two stabilizing support tabs located at the end edge of the main board (extender card) according to present invention.

In FIG. 3 the present invention is shown for the case when the main board is an extender type. FIG. 3 shows two fragments. The first fragment is of said PCI-express card 10 (the below view). Tab 13, short tab 15 and PCI-express plug 11 are shown. Separately are denoted bottom end edge 151 of short tab 15 and the bottom end edge 171 of PCI-express add-in card 10.

The second fragment is of extender card 20. It comprises female socket 21 mounted at upper end edge (lateral surface) 271. At this end edge 271 two support tabs are located, for example: the first support tab (26) and the second support tab (25) and the upper end edge (251) of the short tab (25) and the upper end edge (261) of the opposite located tab 27. These two support tabs (25 and 26) are made of the extender material as one piece (one material).

Figure 4A:
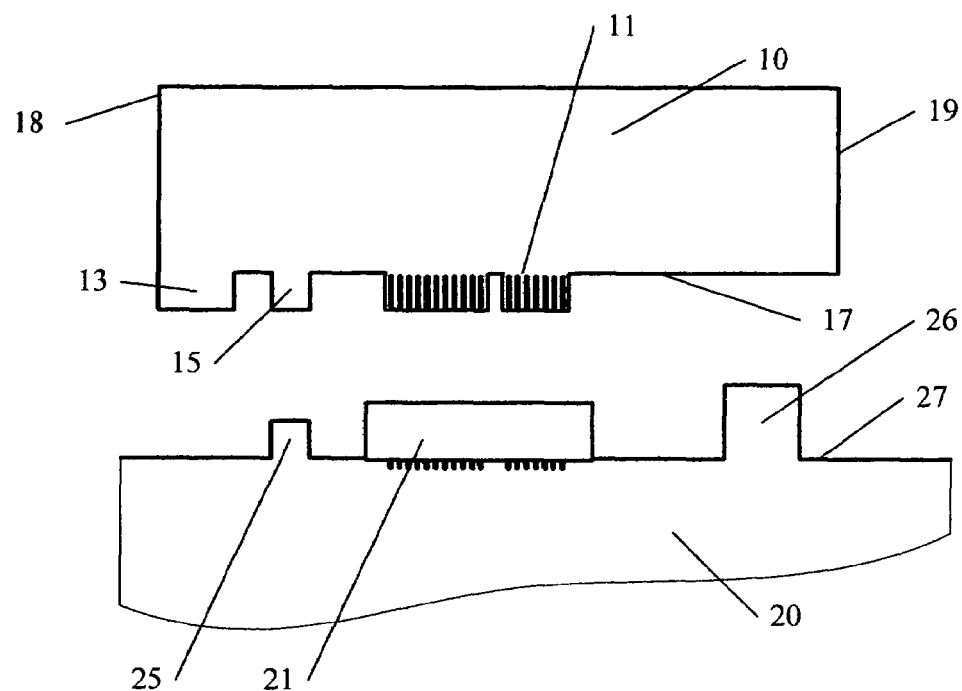
FIG. 4a illustrates the case when the said add-in card and the main board are located against each other separately.
Figure 4B:
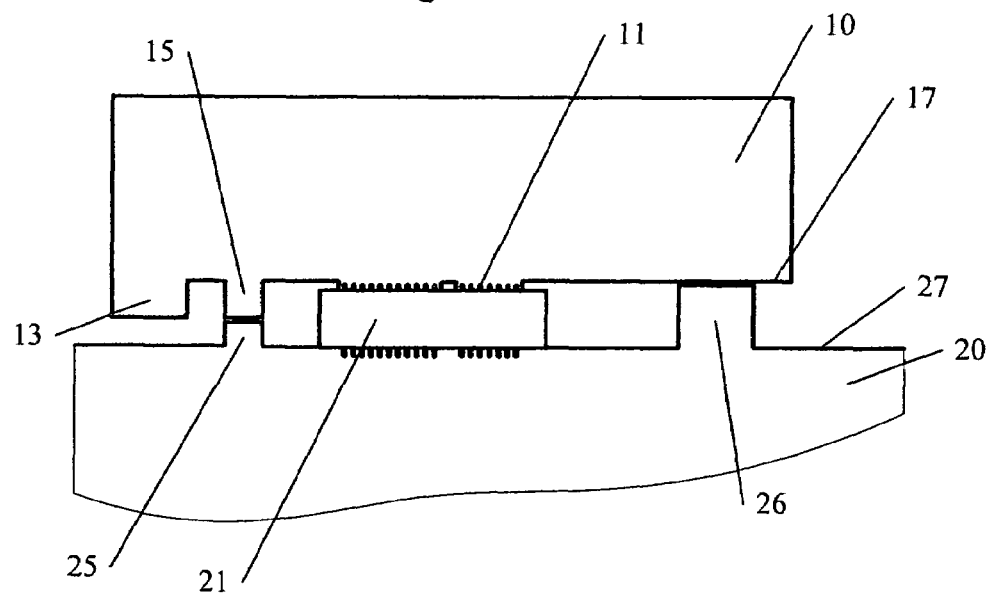
FIG. 4b illustrates the case when said add-in card is inserted into a female socket located on said main board.

In FIG. 4 the cross view of the PCI-express add-in card 10 and the main printed circuit board 20 are shown according to the present invention. In FIG. 4a and FIG. 4b the PCI-express standard add-in card 10 comprises tab 13, short tab 15 and PCI-express male plug 11. In FIG. 4a the PCI-express standard add-in card (10) is represented separately from main printed circuit board 20, for example, PCI-express extender card. Main board 20 comprises female socket 21, the first support tab (26) and the second support tab (25).

In FIG. 4b the PCI-express standard add-in-card (10) is represented in the case when PCI-express male plug 11 is inserted into female socket 21. Support tabs 25 and 26 are located on the two opposite parties of socket 21 and stabilize said PCI-express card 10 in socket 21 in place, thus removing the possibility of electric connection infringement. In most cases it is enough to have only one support tab. This FIG. 4b shows that the geometric form and the position of these support tabs is limited by the edges of the PCI-express add-in card and socket 21. In these figures all tabs have a flat top part for simplicity. FIG. 4b shows that support tab 25 touches to said short tab 15 (more exactly the bottom end edge 251 of tab 15—FIG. 3) and support tab 26 touches to the bottom end edge 271 of PCI-express add-in card 10—FIG. 3).

Figure 5:
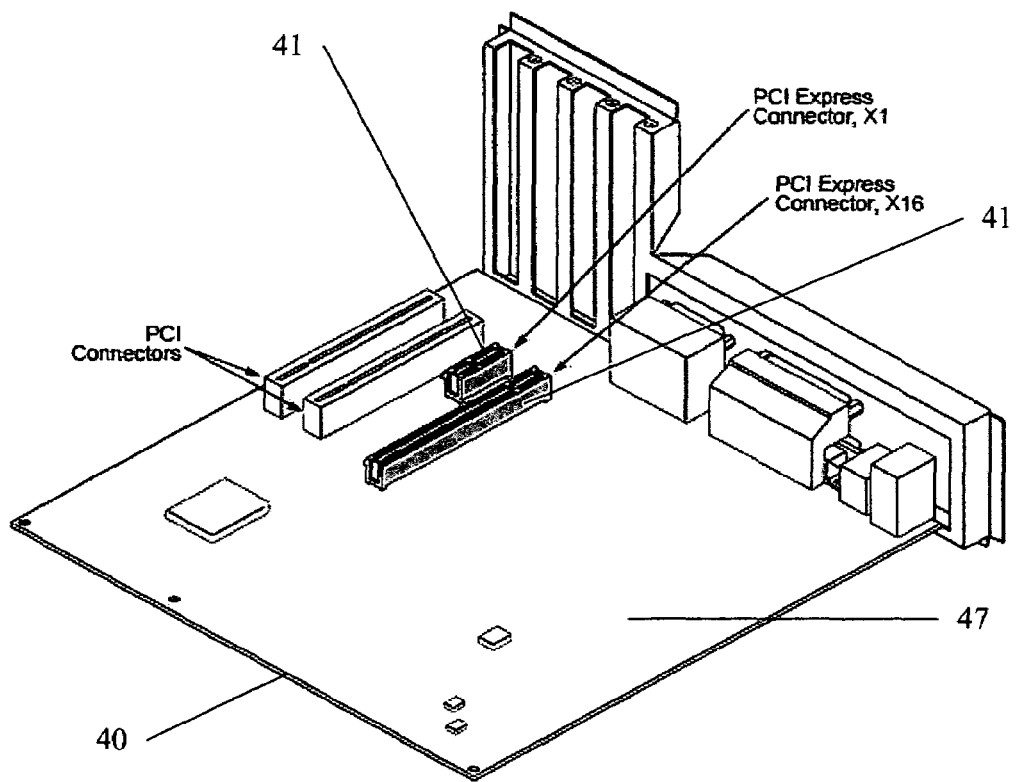
FIG. 5 illustrates the location of the PCI-express connectors (X1 and X16) on the computer motherboard according to the PCI-express standard [1] (prior art).

In FIG. 5 an example from [1] is shown. The two PCI-express female sockets 41 (one of them type X1 and another type X16) are placed on the plane surface 47 of said main board 40 ("motherboard" type).

Figure 6:
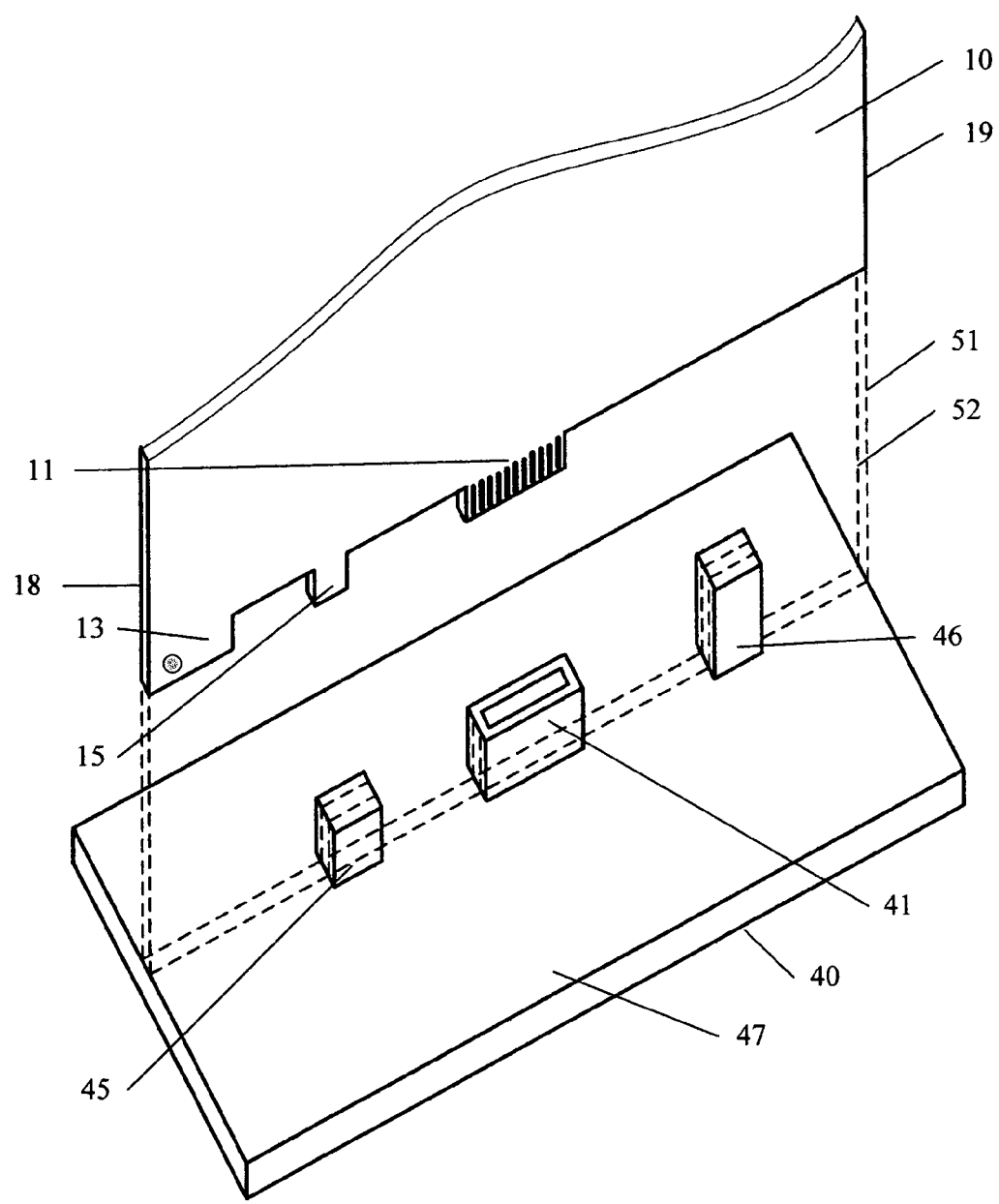
FIG. 6 illustrates the improved computer system for the PCI-express add-in card, including the PCI-express add-in card, main board (motherboard) and two additional stabilizing tabs located on the motherboard in accordance with the present invention.

FIG. 6 shows the support tabs in case the main board 40 is a motherboard type according to the present invention. These support tabs (45 and 46) can have a width no less than the PCI-express add-in card width. It is shown with the help of two imaginary planes 51 and 52. The geometric form of the displayed support tabs 45 and 46 is chosen conveniently for fastening the said support tabs on the surface (47) of motherboard 40.

BIBLIOGRAPHY

1. PCI-Express card electromechanical specification, rev. 1.1.
2. Pat. CN2671035Y, LUO CHENGQI, Improved expanding groove structure of painting chip memory card, 2005, G06K 19/00.
3. Pat. CN2684410Y, LUO CHENGQI, Improved structure for expansion card slot of PCI-express deiction chip card and other deiction temporary storage cards, 2005, G06F 1/16.
4. Pat. CN2672902Y, LUO CHENGQI, Extension groove improved structure of drawing wafer memory temporary storage card, 2005, H01R12/02.
5. Pat. Appl. US20050003692, Allirot R., I/O expansion system and a connector therefor, 2005.
6. U.S. Pat. No. 7,040,934, Ling Y., Mix J. A., Add-in card to backplane connecting apparatus, 2006.

We claim:

1. An improved computer system for PCI-express add-in card comprising:
   a main printed circuit board (PCB);
   an add-in card based on the PCI-Express standard and comprising:
     a male connector plug,
     a short tab for prevention of said PCI-express add-in card plugging into a PCI connector, and
       said short tab is located on a bottom end edge of said PCI-express add-in card;
   a female connector socket located on the upper end edge of said main PCB for plugging-in said male connector plug of said PCI-express add-in card;
   said improved computer system for PCI-express add-in card comprising one or more support tabs located on the upper end edge of said main PCB, each said support tab, characterized in that when said male connector plug of said PCI-express add-in card is inserted into said female connector socket of said main PCB, each said support tab is directed towards said PCI-express add-in card and top points of said support tab touch to the bottom end edge of said PCI-express add-in card.

2. The improved computer system for PCI-express add-in card according to claim 1, wherein top points of one of said support tabs touch to the bottom end edge of said PCI-express add-in card short tab when said male connector plug of said PCI-express add-in card is inserted into said female connector socket of said main PCB.

3. The improved computer system for PCI-express add-in card according to claim 1, wherein top points of one of said support tabs touch to said PCI-express add-in card bottom end edge when said male connector plug of said PCI-express add-in card is inserted into said female connector socket of said main PCB.

4. The improved computer system for PCI-express add-in card according to claim 1, wherein said one or more support tabs are made of said main PCB material.

5. An improved computer system for PCI-express add-in card comprising:
 a main printed circuit board (PCB);
 an add-in card based on the PCI Express standard and comprising:
  a male connector plug and
  a short tab for prevention of said PCI-express add-in card plugging into the PCI connector, and
  said short tab is located on a bottom end edge of said PCI-express add-in card,
 a female connector socket located on the top surface of said main PCB for plugging-in said male connector plug of said PCI-express add-in card;
 said improved computer system for PCI-express add-in card, comprising one or more support tabs located on the top surface of the said main PCB;
 each said support tab characterized in that when said male connector plug of said PCI-express add-in card is inserted into said female connector socket of said main PCB, each said support tab is directed towards said PCI-express add-in card and top points of said support tab touch to the bottom end edge of said PCI-express add-in card.

6. The improved computer system for PCI-express add-in card according to claim 5, wherein top points of one of said support tabs touch to the bottom end edge of said PCI-express add-in card short tab when said male connector plug of said PCI-express add-in card is inserted into said female connector socket of said main PCB.

7. The improved computer system for PCI-express add-in card according to claim 5, wherein top points of one of said support tabs touch to said PCI-express add-in card bottom end edge when said male connector plug of said PCI-express add-in card is inserted into said female connector socket of said main PCB.

* * * * *